(12) United States Patent
Ito et al.

(10) Patent No.: US 10,856,422 B2
(45) Date of Patent: Dec. 1, 2020

(54) METHOD OF FORMING PATTERN ON A SUBSTRATE

(71) Applicant: CANON KABUSHIKI KAISHA, Tokyo (JP)

(72) Inventors: Toshiki Ito, Kawasaki (JP); Shiori Yonezawa, Tokyo (JP); Keiko Chiba, Utsunomiya (JP); Akiko Iimura, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 243 days.

(21) Appl. No.: 15/553,937

(22) PCT Filed: Jan. 27, 2016

(86) PCT No.: PCT/JP2016/000401
§ 371 (c)(1),
(2) Date: Aug. 25, 2017

(87) PCT Pub. No.: WO2016/136141
PCT Pub. Date: Sep. 1, 2016

(65) Prior Publication Data
US 2018/0042117 A1    Feb. 8, 2018

(30) Foreign Application Priority Data

Feb. 27, 2015   (JP) ................. 2015-039403

(51) Int. Cl.
*H05K 3/00* (2006.01)
*G03F 7/00* (2006.01)
(Continued)

(52) U.S. Cl.
CPC ......... *H05K 3/0079* (2013.01); *G03F 7/0002* (2013.01); *G03F 7/027* (2013.01);
(Continued)

(58) Field of Classification Search
CPC .. G02B 5/1809; G02B 5/1852; G02B 5/3025; G03F 7/0002; G03F 7/027; G03F 7/029;
(Continued)

(56) References Cited

U.S. PATENT DOCUMENTS 8,377,322 B2 *  2/2013  Wakamatsu ........... B82Y 10/00
                                                 216/48
8,623,161 B2 *  1/2014  Kaida .................. G02B 5/3058
                                                 156/246
(Continued)

FOREIGN PATENT DOCUMENTS

JP    2006-524919 A    11/2006
JP    2007-186570 A     7/2007
(Continued)

OTHER PUBLICATIONS

H. Gokan, S. Esho, et al., "Dry Etch Resistance of Organic Materials", Nippon Electric Company, Limited, Basic Technology Research Laboratories, Takatsuku Kawasaki 213 Japan; J. Elctrochem Soc; 1983, vol. 130, pp. 143-146.

*Primary Examiner* — Minh N Trinh
(74) *Attorney, Agent, or Firm* — Canon U.S.A., Inc. IP Division

(57) ABSTRACT

Method of forming a pattern by arranging a photocurable composition on a substrate; bringing a mold having a concavo-convex pattern into contact with the composition; irradiating the composition with light to form a cured film; releasing the mold from the cured film; forming a reversal layer on the cured film having a concavo-convex pattern transferred from the mold; partially removing the reversal layer to expose the convexes of the pattern in such a manner that the reversal layer remains in the concaves of the pattern formed on the cured film; and etching the photocurable composition layer using the reversal layer remaining in the concaves as a mask to form a reversal pattern, wherein the (Continued)

mold is brought into contact with the photocurable composition in an atmosphere of a soluble gas having a solubility in the composition; and the soluble gas has a saturation solubility of 38% by volume or more.

12 Claims, 4 Drawing Sheets

(51) Int. Cl.
| | |
|---|---|
| *H01L 21/311* | (2006.01) |
| *H01L 21/033* | (2006.01) |
| *H01L 21/027* | (2006.01) |
| *G03F 7/027* | (2006.01) |
| *G03F 7/029* | (2006.01) |
| *H05K 3/30* | (2006.01) |
| *G02B 5/18* | (2006.01) |
| *G02B 5/30* | (2006.01) |

(52) U.S. Cl.
CPC .......... *G03F 7/029* (2013.01); *H01L 21/0273* (2013.01); *H01L 21/0337* (2013.01); *H01L 21/31144* (2013.01); *H05K 3/30* (2013.01); *G02B 5/1809* (2013.01); *G02B 5/1852* (2013.01); *G02B 5/3025* (2013.01); *H05K 2203/107* (2013.01)

(58) Field of Classification Search
CPC ............. H01L 21/0273; H01L 21/0337; H01L 21/31144
See application file for complete search history.

(56) References Cited

U.S. PATENT DOCUMENTS

| | | | |
|---|---|---|---|
| 9,067,356 B2 * | 6/2015 | Naganuma | G03F 7/0002 |
| 10,023,673 B2 * | 7/2018 | Kato | C08F 2/50 |
| 2004/0211754 A1 | 10/2004 | Sreenivasan | |
| 2016/0366769 A1 * | 12/2016 | Honma | C08F 2/48 |
| 2018/0042117 A1 * | 2/2018 | Ito | G03F 7/027 |

FOREIGN PATENT DOCUMENTS

| | | |
|---|---|---|
| JP | 2013070033 A | 4/2013 |
| JP | 2013-254783 A | 12/2013 |
| JP | 2014-165342 A | 9/2014 |
| JP | 2015029073 A | 2/2015 |
| KR | 20060004679 A | 1/2006 |
| KR | 20080005875 A | 1/2008 |
| WO | 2013/035761 A1 | 3/2013 |
| WO | 2014/208571 A1 | 12/2014 |

* cited by examiner

[Fig. 1A]
STEP [1]
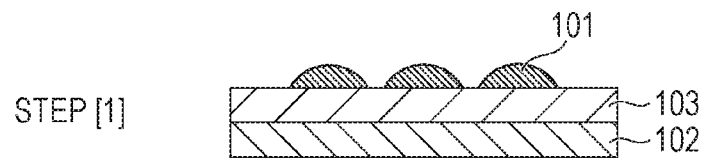
[Fig. 1B]
STEP [2]
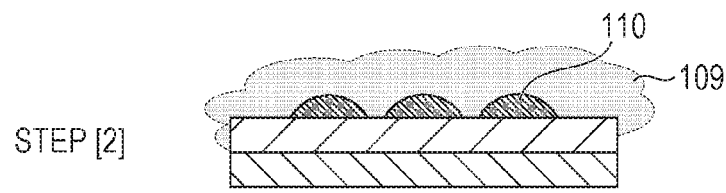
[Fig. 1C]
STEP [3]
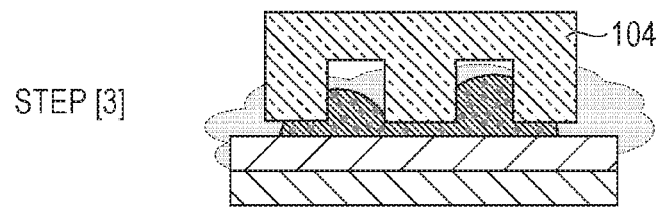
[Fig. 1D]
STEP [3]
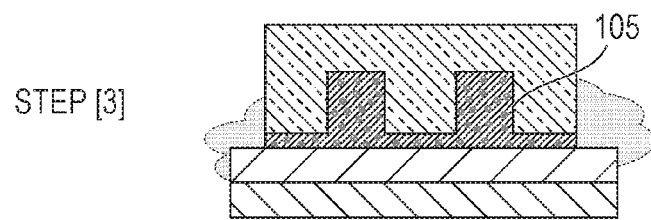

[Fig. 1E]
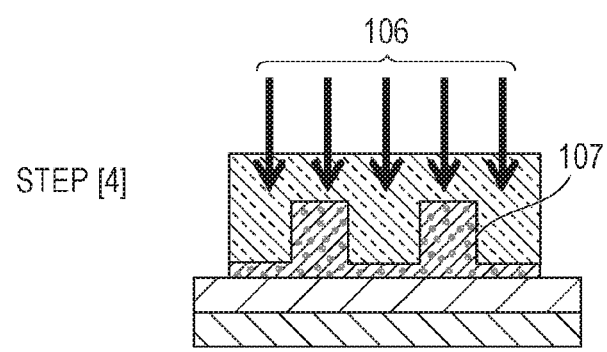
[Fig. 1F]
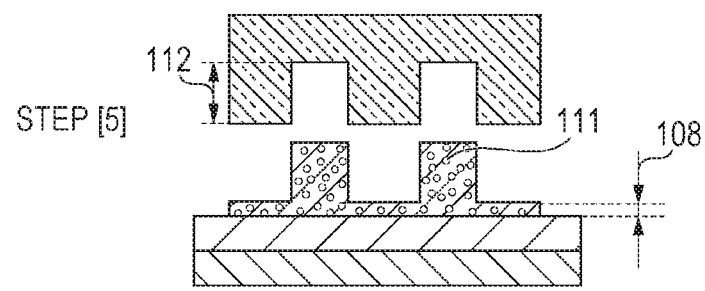

[Fig. 2A]
STEP [6]
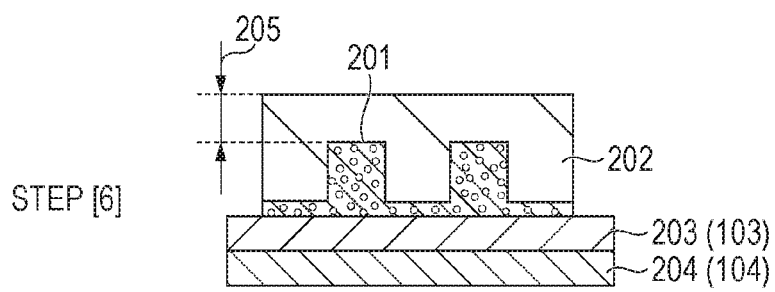
[Fig. 2B]
STEP [7]
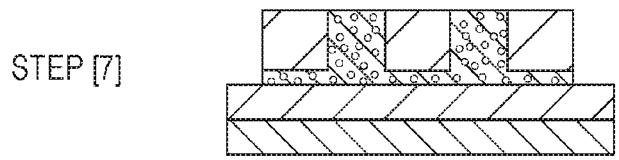
[Fig. 2C]
STEP [8-1]
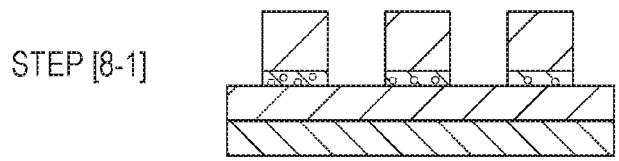
[Fig. 2D]
STEP [8-2]
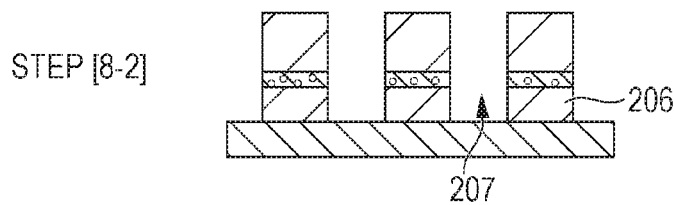

[Fig. 3]
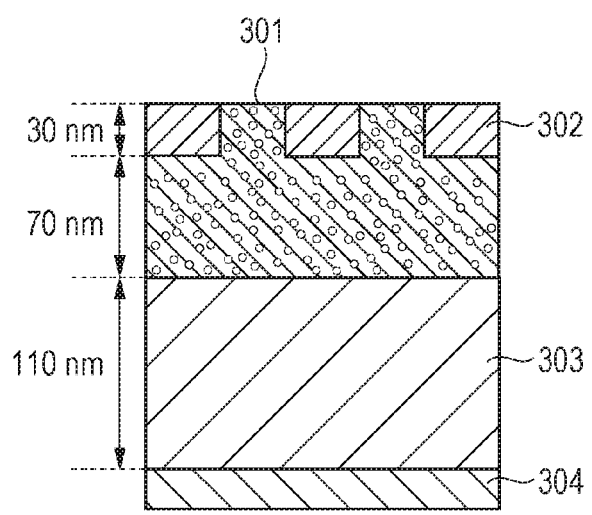

METHOD OF FORMING PATTERN ON A SUBSTRATE

TECHNICAL FIELD

The present invention relates to a method of forming a pattern, a method of producing a processing substrate, a method of producing an optical part, a method of producing a circuit board, and a method of producing an electronic part.

BACKGROUND ART

Demands for miniaturization in devices, such as semiconductor devices and micro-electromechanical systems (MEMS), have been enhanced, and photo-nanoimprinting has been attracting attentions as a fine processing technology.

In photo-nanoimprinting, a mold having a fine concavo-convex pattern on the surface is pressed to a photocurable composition (resist) applied onto a substrate (wafer), and the photocurable composition is cured in this state. As a result, the concavo-convex pattern of the mold is transferred to the cured film of the photocurable composition to form a pattern on the substrate. The photo-nanoimprinting can form a fine structure of the order of several nanometers on a substrate.

In the photo-nanoimprinting described in PTL 1, a resist is first applied to a pattern-forming region on a substrate (arrangement step). Subsequently, this resist is molded with a mold having a pattern (mold contact step). The resist is cured by irradiation with light (light irradiation step), and the mold is then released (mold-releasing step). By the implementation of these steps, a pattern transferred to the resist (photocured film) having a prescribed shape is formed on the substrate (FIGS. 1A to 1F).

The substrate can be further processed by a pattern-reversal process using the pattern prepared by the photo-nanoimprinting as a mask.

In the process disclosed in PTL 2, a reversal layer is formed on a concavo-convex pattern (reversal layer-forming step), the reversal layer is partially removed to expose the resist layer in such a manner that the material constituting the reversal layer remains in the concaves (reversal layer-partially removing step), and the resist layer and also the processing layer lying under the resist layer are etched using the reversal layer remaining in the concaves as a mask to form a reversal pattern made of the material of the reversal layer (etching step).

CITATION LIST

Patent Literature

PTL 1: Japanese Patent Laid-Open No. 2007-186570
PTL 2: PCT Japanese Translation Patent Publication No. 2006-524919

Non Patent Literature

NPL 1: J. Electrochem. Soc., 130, p. 143 (1983)

SUMMARY OF INVENTION

Technical Problem

The photo-nanoimprinting described in PTL 1 uses the concavo-convex pattern itself of the cured film as an etching mask. The resist, i.e., the cured film therefore needs to have a high dry etching resistance.

In contrast, in a reversal process as in that described in PTL 2, a reversal layer is used as an etching mask, and the cured film layer having the concavo-convex pattern is required to be quickly removed. That is, it is necessary that the dry etching rate by an etching gas of the concavo-convex pattern layer is sufficiently higher than the dry etching rate of the reversal layer.

In addition, in order to form a highly precise concavo-convex pattern at high productivity by photo-nanoimprinting, the mask must be peeled off from the photocured film as the resist with less defects (release defects) in the mold-releasing step. The term "release defect" refers to a defect that the resist pattern is torn off and remains on the mask when the mask is released from the resist. Such a defect needs to be decreased. Specifically, when the concavo-convex pattern of a mold has a large pattern height (for example, a height of larger 40 nm), it is presently very difficult to repeatedly form the concavo-convex pattern on a photocured film without causing defects.

Solution to Problem

The present invention provides a method of forming a good pattern through a reversal process.

The present invention relates to a method of forming a pattern. The method includes an arrangement step of arranging a photocurable composition on a substrate; a mold contact step of bringing a mold having a concavo-convex pattern into contact with the photocurable composition; a light irradiation step of irradiating the photocurable composition with light to form a cured film; a mold-releasing step of releasing the mold from the cured film; a reversal layer-forming step of forming a reversal layer on the cured film having the concavo-convex pattern transferred from the mold; a reversal layer-partially removing step of partially removing the reversal layer to expose the convexes of the concavo-convex pattern in such a manner that the reversal layer remains in the concaves of the concavo-convex pattern formed on the cured film; and an etching step of etching the photocurable composition layer using the reversal layer remaining in the concaves as a mask to form a reversal pattern. The mold contact step is performed in an atmosphere of a soluble gas in the photocurable composition. The soluble gas has a saturation solubility in the photocurable composition of 38% by volume or more.

The present invention can provide a method of forming a pattern with a high processing accuracy even if a mold having a small pattern height is used.

Further features of the present invention will become apparent from the following description of an exemplary embodiment with reference to the attached drawings.

BRIEF DESCRIPTION OF DRAWINGS

FIG. 1A is a schematic diagram illustrating a step of exemplary photo-nanoimprinting according to an embodiment of the present invention.

FIG. 1B is a schematic diagram illustrating another step of the photo-nanoimprinting.

FIG. 1C is a schematic diagram illustrating another step of the photo-nanoimprinting.

FIG. 1D is a schematic diagram illustrating another step of the photo-nanoimprinting.

FIG. 1E is a schematic diagram illustrating another step of the photo-nanoimprinting.

FIG. 1F is a schematic diagram illustrating another step of the photo-nanoimprinting.

FIG. 2A is a schematic cross-sectional view illustrating a step of an exemplary reversal process according to the embodiment.

FIG. 2B is a schematic cross-sectional view illustrating another step of the reversal process.

FIG. 2C is a schematic cross-sectional view illustrating another step of the reversal process.

FIG. 2D is a schematic cross-sectional view illustrating another step of the reversal process.

FIG. 3 is a schematic cross-sectional view illustrating an example according to the embodiment and a comparative example.

DESCRIPTION OF EMBODIMENT

An embodiment of the present invention will now be described in detail with appropriate reference to the drawings. The present invention, however, not limited to the embodiment described below. The embodiment can be appropriately modified or improved within a scope not departing from the gist of the invention based on knowledge of those skilled in the art, and such modifications and improvements are also encompassed in the present invention.

Photocurable Composition

The photocurable composition according to the embodiment includes a polymerizable compound component (A) and a photopolymerization initiator component (B). The photocurable composition according to the embodiment may further include a non-polymerizable compound component (C).

Throughout the specification, the term "cured film" refers to a film cured by polymerization of a photocurable composition on a substrate. The cured film may have any shape and may have a pattern on the surface.

Each component will now be described in detail.

Component (A): Polymerizable Compound

The component (A) is a polymerizable compound. Throughout the specification, the term "polymerizable compound" refers to a compound that reacts with a polymerizing factor (such as a radical) generated from a photopolymerization initiator (component (B)) and forms a polymer compound film through a chain reaction (polymerization reaction).

Such a polymerizable compound is, for example, a radical polymerizable compound. The component (A) may contain a single polymerizable compound or a plurality of polymerizable compounds.

The radical polymerizable compound can be a compound having one or more acryloyl or methacryloyl groups, i.e., a (meth)acrylic compound. Accordingly, the component (A) of the photocurable composition according to the embodiment can contain a (meth)acrylic compound, can mainly contain a (meth)acrylic compound, or can be a (meth)acrylic compound. The phrase "component (A) mainly contains a (meth)acrylic compound" refers to that the (meth)acrylic compound accounts for 90% by weight or more of the component (A).

A radical polymerizable compound composed of a plurality of compounds each having one or more acryloyl or methacryloyl groups can contain a monofunctional (meth)acrylic monomer and a polyfunctional (meth)acrylic monomer. A combination of a monofunctional (meth)acrylic monomer and a polyfunctional (meth)acrylic monomer can provide a cured film having a high mechanical strength.

Examples of the monofunctional (meth)acrylic compound having one acryloyl or methacryloyl group include, but not limited to, phenoxyethyl (meth)acrylate, phenoxy-2-methylethyl (meth)acrylate, phenoxyethoxyethyl (meth)acrylate, 3-phenoxy-2-hydroxypropyl (meth)acrylate, 2-phenylphenoxyethyl (meth)acrylate, 4-phenylphenoxyethyl (meth)acrylate, 3-(2-phenylphenyl)-2-hydroxypropyl (meth)acrylate, EO-modified p-cumylphenol (meth)acrylate, 2-bromophenoxyethyl (meth)acrylate, 2,4-dibromophenoxyethyl (meth)acrylate, 2,4,6-tribromophenoxyethyl (meth)acrylate, EO-modified phenoxy (meth)acrylate. PO-modified phenoxy (meth)acrylate, polyoxyethylene nonylphenyl ether (meth)acrylate, isobornyl (meth)acrylate, 1-adamantyl (meth)acrylate, 2-methyl-2-adamantyl (meth)acrylate, 2-ethyl-2-adamantyl (meth)acrylate, bornyl (meth)acrylate, tricyclodecanyl (meth)acrylate, dicyclopentanyl (meth)acrylate, dicyclopentenyl (meth)acrylate, cy-clohexyl (meth)acrylate, 4-butylcyclohexyl (meth)acrylate, acryloyl morpholine, 2-hydroxyethyl (meth)acrylate, 2-hydroxypropyl (meth)acrylate, 2-hydroxybutyl (meth)acrylate, methyl (meth)acrylate, ethyl (meth)acrylate, propyl (meth)acrylate, isopropyl (meth)acrylate, butyl (meth)acrylate, amyl (meth)acrylate, isobutyl (meth)acrylate, t-butyl (meth)acrylate, pentyl (meth)acrylate, isoamyl (meth)acrylate, hexyl (meth)acrylate, heptyl (meth)acrylate, octyl (meth)acrylate, isooctyl (meth)acrylate, 2-ethylhexyl (meth)acrylate, nonyl (meth)acrylate, decyl (meth)acrylate, isodecyl (meth)acrylate, undecyl (meth)acrylate, dodecyl (meth)acrylate, lauryl (meth)acrylate, stearyl (meth)acrylate, isostearyl (meth)acrylate, benzyl (meth)acrylate, tetrahydrofurfuryl (meth)acrylate, butoxyethyl (meth)acrylate, ethoxydiethylene glycol (meth)acrylate, polyethylene glycol mono(meth)acrylate, polypropylene glycol mono(meth)acrylate, methoxyethylene glycol (meth)acrylate, ethoxyethyl (meth)acrylate, methoxypolyethylene glycol (meth)acrylate, methoxy-polypropylene glycol (meth)acrylate, diacetone (meth)acrylamide, isobutoxymethyl (meth)acrylamide, N,N-dimethyl (meth)acrylamide, t-octyl (meth)acrylamide, dimethylaminoethyl (meth)acrylate, diethylaminoethyl (meth)acrylate, 7-amino-3,7-dimethyloctyl (meth)acrylate, N,N-diethyl (meth)acrylamide, and N,N-dimethylaminopropyl (meth)acrylamide.

Examples of commercially available products of the monofunctional (meth)acrylic compound include, but not limited to, Aronix (registered trademark) series M101, M102, M110, M111, M113, M117, M5700, TO-1317, M120, M150, and M156 (manufactured by Toagosei Co., Ltd.), MEDOL 10, MIBDOL 10, CHDOL 10, MMDOL 30, MEDOL 30, MIBDOL 30, CHDOL 30, LA, IBXA, 2-MTA, HPA, and Viscoat series #150, #155, #158, #190, #192, #193, #220, #2000, #2100, and #2150 (manufactured by Osaka Organic Chemical Industry Ltd.), Light Acrylate series BO-A, EC-A, DMP-A, THF-A, HOP-A, HOA-MPE, HOA-MPL, PO-A, P-200A, NP-4EA, and NP-8EA, and Epoxy Ester M-600A (manufactured by Kyoeisha Chemical Co., Ltd.), KAYARAD (registered trademark) series TC110S, R-564, and R-128H (manufactured by Nippon Kayaku Co., Ltd.), NK Ester series AMP-10G and AMP-20G (manufactured by Shin-Nakamura Chemical Co., Ltd.), FA series 511A, 512A, and 513A (manufactured by Hitachi Chemical Company, Ltd.), PHE, CEA, PHE-2, PHE-4, BR-31, BR-31M, and BR-32 (manufactured Dai-ichi Kogyo Seiyaku Co., Ltd.), VP (manufactured by BASF), and ACMO, DMAA, and DMAPAA (manufactured by Kohjin Co., Ltd.).

Examples of the polyfunctional (meth)acrylic compound having at least two acryloyl or methacryloyl groups include, but not limited to, trimethylolpropane di(meth)acrylate, trimethylolpropane tri(meth)acrylate, EO-modified trimethylolpropane tri(meth)acrylate, PO-modified trimethylolpropane tri(meth)acrylate, EO,PO-modified trimethylolpropane tri(meth)acrylate, dimethyloltricyclodecane di(meth)acrylate, pentaerythritol tri(meth)acrylate, pentaerythritol tetra(meth)acrylate, ethylene glycol di(meth)acrylate, tetraethylene glycol di(meth)acrylate, polyethylene glycol di(meth)acrylate, polypropylene glycol di(meth)acrylate, 1,4-butanediol di(meth)acrylate, 1,6-hexanediol di(meth)acrylate, neopentyl glycol di(meth)acrylate, 1,9-nonanediol di(meth)acrylate, 1,10-decanediol di(meth)acrylate, 1,3-adamantanedimethanol di(meth)acrylate, tris(2-hydroxyethyl)isocyanurate tri(meth)acrylate, tris(acryloyloxy)isocyanurate, bis(hydroxymethyl)tricyclodecane di(meth)acrylate, dipentaerythritol penta(meth)acrylate, dipentaerythritol hexa(meth)acrylate, EO-modified 2,2-bis(4-((meth)acryloxy)phenyl)propane, PO-modified 2,2-bis(4-((meth)acryloxy)phenyl)propane, and EO,PO-modified 2,2-bis(4-((meth)acryloxy)phenyl)propane.

Examples of commercially available products of the polyfunctional (meth)acrylic compound include, but not limited to, Yupimer (registered trademark) series UV SA1002 and SA2007 (manufactured by Mitsubishi Chemical Corporation), Viscoat series #195, #230, #215, #260, #335HP, #295, #300, #360, and #700, GPT, and 3PA (manufactured by Osaka Organic Chemical Industry Ltd.), Light Acrylate series 4EG-A, 9EG-A, NP-A, DCP-A, BP-4EA, BP-4PA, TMP-A, PE-3A, PE-4A, and DPE-6A (manufactured by Kyoeisha Chemical Co., Ltd.), KAYARAD (registered trademark) series PET-30, TMPTA, R-604, DPHA, DPCA-20, DPCA-30, DPCA-60. DPCA-120, HX-620, D-310, and D-330 (manufactured by Nippon Kayaku Co., Ltd.), Aronix (registered trademark) series M208, M210, M215, M220, M240, M305, M309, M310, M315, M325, and M400 (manufactured by Toagosei Co., Ltd.), and Ripoxy (registered trademark) series VR-77, VR-60, and VR-90 (manufactured by Showa Denko K.K.).

In the above-mentioned groups of compounds, the term "(meth)acrylate" refers to an acrylate or a methacrylate having an alcohol residue equivalent to that of the acrylate; the term "(meth)acryloyl group" refers to an acryloyl group or a methacryloyl group having an alcohol residue equivalent to that of the acryloyl group; the term "EO" refers to ethylene oxide, and the term "EO-modified compound A" refers to that the (meth)acrylic acid residue and the alcohol residue of compound A are bound to each other via a block structure of an ethylene oxide group; and the term "PO" refers to propylene oxide, and the term "PO-modified compound B" refers to that the (meth)acrylic acid residue and the alcohol residue of compound B are bound to each other via a block structure of a propylene oxide group.

Component (B): Photopolymerization Initiator

The component (B) is a photopolymerization initiator.

Throughout the specification, the term "photopolymerization initiator" refers to a compound that perceives light of a prescribed wavelength and generates a polymerizing factor (radical). Specifically, the photopolymerization initiator is a polymerization initiator (radical generator) generating radicals by light (infrared rays, visible rays, ultraviolet rays, far ultraviolet rays, X-rays, charged particle rays such as electron beams, or radiation rays).

The component (B) may be composed of a single photopolymerization initiator or a plurality of photopolymerization initiators.

Examples of the radical generator include, but not limited to, optionally substituted 2,4,5-triarylimidazole dimers, such as a 2-(o-chlorophenyl)-4,5-diphenylimidazole dimer, a 2-(o-chlorophenyl)-4,5-di(methoxyphenyl)imidazole dimer, a 2-(o-fluorophenyl)-4,5-diphenylimidazole dimer, and a 2-(o- or p-methoxyphenyl)-4,5-diphenylimidazole dimer; benzophenone and benzophenone derivatives, such as N,N'-tetramethyl-4,4'-diaminobenzophenone (Michler's ketone). N,N'-tetraethyl-4,4'-diaminobenzophenone, 4-methoxy-4'-dimethylaminobenzophenone, 4-chlorobenzophenone, 4,4'-dimethoxybenzophenone, and 4,4'-diaminobenzophenone; alpha-amino aromatic ketone derivatives, such as 2-benzyl-2-dimethylamino-1-(4-morpholinophenyl)-butanone-1,2-methyl-1-[4-(methyl thio)phenyl]-2-morpholino-propanon-1-one, quinones, such as 2-ethylanthraquinone, phenanthrenequinone, 2-t-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone, and 2,3-dimethylanthraquinone; benzoin ether derivatives, such as benzoin methyl ether, benzoin ethyl ether, and benzoin phenyl ether; benzoin and benzoin derivatives, such as methylbenzoin, ethylbenzoin, and propylbenzoin; benzyl derivatives, such as benzyl dimethyl ketal; acridine derivatives, such as 9-phenylacridine and 1,7-bis(9,9'-acridinyl)heptane; N-phenylglycine and N-phenylglycine derivatives; acetophenone and acetophenone derivatives, such as 3-methylacetophenone, acetophenone benzyl ketal, 1-hydroxycyclohexyl phenyl ketone, and 2,2-dimethoxy-2-phenylacetophenone; thioxanthone and thioxanthone derivatives, such as diethylthioxanthone, 2-isopropylthioxanthone, and 2-chlorothioxanthone; acylphosphine oxide derivatives, such as 2,4,6-trimethylbenzoyldiphenylphosphine oxide, bis(2,4,6-trimethylbenzoyl)phenylphosphine oxide, and bis(2,6-dimethoxybenzoyl)-2,4,4-trimethylpentylphosphine oxide; oxime ester derivatives, such as 1,2-octanedione. 1-[4-(phenylthio)-,2-(O-benzoyloxime)], ethanone, and 1-[9-ethyl-6-(2-methylbenzoyl)-9H-carbazol-3-yl]-, 1-(O-acetyloxime); and xanthone, fluorenone, benzaldehyde, fluorene, anthraquinone, triphenylamine, carbazole, 1-(4-isopropylphenyl)-2-hydroxy-2-methylpropan-1-one, and 2-hydroxy-2-methyl-1-phenyl-propan-1-one.

Examples of commercially available products of the radical generator include, but not limited to, Irgacure series 184, 369, 651, 500, 819, 907, 784, 2959, CGI-1700, CGI-1750, CGI-1850, and CG24-61, Darocur (registered tradename) series 1116 and 1173, and Lucirin (registered tradename) series TPO, LR8893, and LR8970 (manufactured by BASF); and Ebecryl P36 (manufactured by UCB).

Among these polymerization initiators, in particular, the component (B) can be an acylphosphine oxide polymerization initiator. Among the above-mentioned examples, acylphosphine oxide compounds, such as 2,4,6-trimethylbenzoyldiphenylphosphine oxide, bis(2,4,6-trimethylbenzoyl)phenylphosphine oxide, and bis(2,6-dimethoxybenzoyl)-2, 4,4-trimethylpentylphosphine oxide, are acylphosphine oxide polymerization initiators.

The blending ratio of the photopolymerization initiator component (B) in the photocurable composition can be 0.1% by weight or more and 50% by weight or less, preferably 0.1% by weight or more and 20% by weight or less, and more preferably higher than 10% by weight and 20% by weight or less, based on the total weight of the component (A), the component (B), and the component (C) described below, i.e., the total weight of all components excluding the solvent.

A blending ratio of the component (B) of 0.1% by weight or more based on the total weight of the component (A), the component (B), and the component (C) can enhance the curing rate of the composition to increase the reaction efficiency. A blending ratio of the component (B) of 50% by weight or less based on the total weight of the component (A), the component (B), and the component (C) can provide a cured film having a certain mechanical strength.

Component (C): Non-Polymerizable Compound

The photocurable composition according to the embodiment can contain, in addition to the component (A) and the component (B), a non-polymerizable compound component (C) according to various purposes within a range that does not impair the effects of the present invention. Such a component (C) is, for example, a compound that does not have any polymerizable functional group such as a (meth) acryloyl group and does not have ability of generating a polymerizing factor (radical) by perceiving light of a prescribed wavelength. Examples of the compound include sensitizers, hydrogen donors, internal mold release agents, surfactants, antioxidants, polymer components, and other additives. The component (C) may contain two or more of these compounds.

The sensitizer is optionally added for accelerating the polymerization reaction or improving the reaction conversion rate. The sensitizer is, for example, a sensitizing dye.

The sensitizing dye is a compound that is excited by absorbing light of a specific wavelength and interacts with the photopolymerization initiator component (B). The interaction herein is, for example, energy transfer or electron transfer from the sensitizing dye in an excited state to the photopolymerization initiator component (B).

Examples of the sensitizing dye include, but not limited to, anthracene derivatives, anthraquinone derivatives, pyrene derivatives, perylene derivatives, carbazole derivatives, benzophenone derivatives, thioxanthone derivatives, xanthone derivatives, coumarin derivatives, phenothiazine derivatives, camphorquinone derivatives, acridine dyes, thiopyrylium salt dyes, merocyanine dyes, quinoline dyes, styrylquinoline dyes, ketocoumarin dyes, thioxanthene dyes, xanthene dyes, oxonol dyes, cyanine dyes, rhodamine dyes, and pyrylium salt dyes.

The sensitizers may be used alone or in a mixture of two or more thereof.

The hydrogen donor is a compound that reacts with an initiating radical generated from the photopolymerization initiator component (B) or with a radical of the polymerization growth terminal to generate a radical having higher reactivity. The hydrogen donor is added, in particular, when the photopolymerization initiator component (B) is a photoradical generator.

Examples of the hydrogen donor include, but not limited to, amine compounds, such as n-butylamine, di-n-butylamine, tri-n-butylphosphine, allylthiourea, s-benzylisothiuronium-p-toluene sulfinate, triethylamine, diethylaminoethyl methacrylate, triethylenetetramine, 4,4'-bis(dialkylamino) benzophenone, N,N-dimethylaminobenzoic acid ethyl ester, N,N-dimethylaminobenzoic acid isoamyl ester, pentyl-4-dimethylamino benzoate, triethanolamine, and N-phenylglycine; and mercapto compounds, such as 2-mercapto-N-phenylbenzimidazole and mercapto-propionic acid ester.

The hydrogen donors may be used alone or in a mixture of two or more thereof. The hydrogen donor may have a function as a sensitizer.

The photocurable composition can contain an internal mold release agent for reducing the interface bonding force between a mold and a resist, i.e., for reducing the mold-releasing force in the mold-releasing step described below. Throughout the specification, the term "internal" of the internal mold release agent refers to that the mold release agent is added to the photocurable composition in advance before the arrangement step of the photocurable composition.

The internal mold release agent can be a surfactant, such as a silicone surfactant, a fluorosurfactant, or a hydrocarbon surfactant. In the present invention, the internal mold release agent does not have polymerizability.

Examples of the fluorosurfactant include polyalkylene oxide (e.g., polyethylene oxide or polypropylene oxide) adducts of alcohols having perfluoroalkyl groups and polyalkylene oxide (e.g., polyethylene oxide or polypropylene oxide) adducts of per-fluoropolyethers. The fluorosurfactant may have, for example, a hydroxyl group, an alkoxy group, an alkyl group, an amino group, or a thiol group as a part of the molecular structure (e.g., terminal group).

The fluorosurfactant may be a commercially available one. Examples of the commercial product of the fluorosurfactant include Megafac (registered trademark) series F-444, TF-2066, TF-2067, and TF-2068 (manufactured by DIC Corporation), Fluorad series FC-430 and FC-431 (manufactured by Sumitomo 3M Limited), Surftlon (registered trademark)S-382 (manufactured by Asahi Glass Co., Ltd.), EFTOP series EF-122A, 122B, 122C, EF-121, EF-126, EF-127, and MF-100 (manufactured by Tohchem Products Co., Ltd.). PF-636, PF-6320, PF-656, and PF-6520 (manufactured by OMNOVA Solutions Inc.), Unidyne (registered trademark) series DS-401, DS-403, and DS-451 (manufactured by Daikin Industries, Ltd.), and Ftergent series 250, 251, 222F, and 208G (manufactured by Neos Corporation).

The internal mold release agent may be a hydrocarbon surfactant.

Examples of the hydrocarbon surfactant include polyalkylene oxide adducts of alkyl alcohols in which alkylene oxide having 2 to 4 carbon atoms is added to alkyl alcohol having 1 to 50 carbon atoms.

Examples of the polyalkylene oxide adducts of alkyl alcohols include an ethylene oxide adduct of methyl alcohol, an ethylene oxide adduct of decyl alcohol, an ethylene oxide adduct of lauryl alcohol, an ethylene oxide adduct of cetyl alcohol, an ethylene oxide adduct of stearyl alcohol, and an ethylene oxide/propylene oxide adduct of stearyl alcohol. The terminal group of the polyalkylene oxide adduct of alkyl alcohol is not limited to a hydroxyl group, which can be produced by merely adding a polyalkylene oxide to an alkyl alcohol. The hydroxyl group may be substituted by another substituent, e.g., a polar functional group such as a carboxyl group, an amino group, a pyridyl group, a thiol group, or a silanol group; or a hydrophobic functional group such as an alkyl group.

The polyalkylene oxide adduct of alkyl alcohol may be a commercially available one. Examples of the commercially available adduct include BLAUNON MP-400, BLAUNON MP-550, and BLAUNON MP-1000 (polyoxyethylene methyl ether: ethylene oxide adduct of methyl alcohol) manufactured by Aoki Oil Industrial Co., Ltd.; FINESURF (registered trademark) series D-1303, D-1305, D-1307, and D-1310 (polyoxyethylene decyl ether: ethylene oxide adduct of decyl alcohol) manufactured by Aoki Oil Industrial Co., Ltd.; BLAUNON EL-1505 (polyoxyethylene lauryl ether: ethylene oxide adduct of lauryl alcohol) manufactured by Aoki Oil Industrial Co., Ltd.; BLAUNON series CH-305 and CH-310 (polyoxyethylene cetyl ether ethylene oxide adduct of cetyl alcohol) manufactured by Aoki Oil Industrial Co., Ltd.; BLAUNON series SR-705, SR-707, SR-715, SR-720, SR-730, and SR-750 (polyoxyethylene stearyl ether: ethylene oxide adduct of stearyl alcohol) manufactured by Aoki Oil Industrial Co., Ltd.; BLAUNON series SA-50/50 1000R and SA-30/70 2000R (polyoxyethylene polyoxypropylene stearyl ether prepared by random polymerization) manufactured by Aoki Oil Industrial Co., Ltd.; Pluriol A760E (polyoxyethylene methyl ether) manufactured by BASF; and Emulgen series (polyoxyethylene alkyl ether) manufactured by Kao Corporation.

Among these hydrocarbon surfactants, the internal mold release agent can be a polyalkylene oxide adduct of alkyl alcohol, in particular, a polyalkylene oxide adduct of long-chain alkyl alcohol.

The internal mold release agents may be used alone or in a mixture of two or more thereof.

The blending ratio of the non-polymerizable compound component (C) in the photocurable composition can be 0% by weight or more and 50% by weight or less, preferably 0.1% by weight or more and 50% by weight or less, and more preferably 0.1% by weight or more and 20% by weight or less, based on the total weight of the component (A), the component (B), and the component (C), i.e., the total weight of all components excluding the solvent.

A blending ratio of the component (C) of 50% by weight or less based on the total weight of the component (A), the component (B), and the component (C) can provide a cured film having a certain mechanical strength.

Component (D): Solvent

The photocurable composition according to the embodiment may contain a solvent component (D). The component (D) may be any solvent that can dissolve the component (A), the component (B), and the component (C). The solvent can have a boiling point of 80 degrees Celsius or more and 200 degrees Celsius or less at a normal pressure. The solvent can have at least one of an ester structure, a ketone structure, a hydroxyl group, and an ether structure. Specifically, the solvent can be one of or a mixture of propylene glycol monomethyl ether acetate, propylene glycol monomethyl ether, cyclohexanone, 2-heptanone, gamma-butyrolactone, and ethyl lactate.

Saturation Solubility of Soluble Gas in Photocurable Composition

The method of forming a pattern of the present invention includes a soluble gas-filling step described below of dissolving a soluble gas in the photocurable composition and photocuring the composition in such a state. Throughout the specification, the term "soluble gas" refers to a gas that is dissolved in the photocurable composition in an amount of 1% by volume or more (the volume of the photocurable composition before the dissolution is defined as 100%). In the present invention, the soluble gas is dissolved in the photocurable composition and is uniformly dispersed therein. The soluble gas present in a photocured film volatilizes by exposing the film to an insoluble gas atmosphere, such as an air atmosphere, after the mold-releasing step described below.

The holes generated by volatilization of the dissolved soluble gas after the mold-releasing are filled with air or vacuum, that is, the photocured film is believed to be porous. This suggests that when the solubility of a soluble gas in a photocurable composition is X % by volume (the volume of the resist is defined as 100%), the dry etching rate of a photocured film of the photocurable composition produced in an atmosphere of the soluble gas is higher by (100+X)/100 times than that of a photocured film of the photocurable composition produced in an atmosphere of an insoluble gas.

A higher dry etching rate allows the resist etching step in the reversal process described below to be promptly accomplished. Consequently, the processing accuracies of the resist etching step and the processing layer etching step become high. The details will be described in the paragraph of pattern-forming step.

The saturation solubility of the soluble gas in the photocurable composition according to the embodiment can be 38% by volume or more and 120% by volume or less. A saturation solubility of less than 38% by volume cannot sufficiently exhibit the effects of the present invention. A saturation solubility of higher than 120% by volume causes problems, such as a low photocuring rate of the photocurable composition and low mechanical properties of the photocured film.

Method of Measuring Saturation Solubility of Soluble Gas in Photocurable Composition The saturation solubility of a soluble gas in the photocurable composition according to the embodiment can be measured by, for example, putting the photocurable composition in a bottle, bubbling the soluble gas at 23 degrees Celsius and 1 atm. and dividing the increased volume by the bubbling by the volume before the bubbling.

Temperature of Photocurable Composition at the Time of Blending

In the preparation of the photocurable composition of the embodiment, at least the component (A) and the component (B) are mixed and dissolved under prescribed temperature conditions, specifically, ranging from 0 degrees Celsius to 100 degrees Celsius. This also applies to a photocurable composition containing the non-polymerizable compound component (C).

Viscosity of Photocurable Composition

The viscosity of the photocurable composition is determined depending on the composition of each component of the photocurable composition.

The mixture of the components excluding the solvent (component (D)) of the photocurable composition according to the embodiment can have a viscosity of 1 mPa*s or more and 100 mPa*s or less at 25 degrees Celsius, preferably 1 mPa*s or more and 50 mPa*s or less, and more preferably 1 mPa*s or more and 12 mPa*s or less.

A soluble gas having a lower viscosity can promptly and uniformly diffuse in the photocurable composition and can further effectively perform the present invention.

A photocurable composition having a viscosity of 100 mPa*s or less can fill the concaves of a fine pattern on a mold within a short period of time when it is brought into contact with the mold. That is, the use of the photocurable composition according to the embodiment allows photonanoimprinting to be performed with high productivity. Pattern defects due to filling failure are also prevented.

A viscosity of 1 mPa*s or more prevents uneven coating of the photocurable composition in application onto a substrate and also prevents flowing out of the photocurable composition from the end of a mold in the contact with the mold.

Surface Tension of Photocurable Composition

The surface tension at 23 degrees Celsius of a mixture of the components excluding the solvent (component (D)) in the photocurable composition of the embodiment is preferably 5 mN/m or more and 70 mN/m or less, more preferably 7 mN/m or more and 35 mN/m or less, and most preferably 10 mN/m or more and 32 mN/m or less. A photocurable composition having a surface tension of 5 mN/m or more can fill the concaves of a fine pattern on a mold within a short period of time in the contact with the mold.

A surface tension of 70 mN/m or less allows the photocurable composition to be cured into a cured film having a smooth surface.

Impurity Contamination of Photocurable Composition

The photocurable composition according to the embodiment should contain impurities as less as possible. The term "impurities" refers to substances other than the above-described components (A) to (D).

Accordingly, the photocurable composition according to the embodiment can be subjected to a purification step. The purification step can be, for example, filtration through a filter.

Specifically, the filtration through a filter can be performed by filtering a mixture of the component (A), the component (B), and the optional components described above through, for example, a filter having a pore diameter of 0.001 µm or more and 5.0 µm or less. The filtration through a filter can be multi-stage filtration or may be repeated multiple times. The filtrate may be re-filtered. The filtration may be performed through a plurality of filters having different pore diameters. The filter for the filtration may be any filter, and examples of the material of the filter include, but not limited to, polyethylene resins, polypropylene resins, fluororesins, and nylon resins.

Such a purification step can remove impurities such as particles contaminating the photocurable composition. As a result, irregularities that are carelessly caused by impurities such as particles in the cured film produced by curing the photocurable composition can be prevented from being caused to prevent pattern defects from occurring.

In a case of using the photocurable composition according to the embodiment for producing a semiconductor integrated circuit, contamination of the photocurable composition by impurities (metal impurities) containing metal atoms should be avoided as much as possible, in order not to obstruct the behavior of the product. Accordingly, the concentration of metal impurities contained in the photocurable composition should be 10 ppm or less, furthermore, 100 ppb or less.

Method of Producing Film Having Pattern

A method of producing a patterned cured film according to the embodiment will now be described. FIGS. 1A to 1F are schematic cross-sectional views illustrating an example of the method of producing a patterned cured film according to the embodiment.

The method of producing a patterned film according to the embodiment comprises:

a first step [1] of arranging the photocurable composition of the embodiment described above on a substrate;

a second step [2] of supplying a soluble gas;

a third step [3] of bringing a mold into contact with the photocurable composition;

a fourth step [4] of irradiating the photocurable composition with light; and a fifth step [5] of releasing the mold from the cured film prepared in the step [4].

The method of producing a patterned cured film according to the embodiment is a method of producing a film through photo-nanoimprinting.

The cured film prepared by the method of producing a patterned cured film according to the embodiment can have a pattern having a size of 1 nm or more and 10 mm or less, in particular, 10 nm or more and 100 µm or less. In general, a pattern-forming technique for producing a film having a nanosized (1 nm or more and 100 nm or less) pattern (concavo-convex structure) using light is called photo-nanoimprinting. The method of producing a patterned cured film according to the embodiment utilizes the photo-nanoimprinting.

Each step will now be described.

[Step [1]: Arrangement]

In this step (arrangement step), as shown in FIG. 1A, the photocurable composition 101 according to the embodiment described above is arranged (applied) on a substrate 102 to form a coating film.

The substrate 102 on which the photocurable composition 101 is arranged is a processing substrate and is usually a silicon wafer. The substrate 102 may be provided with a processing layer 103 thereon. Furthermore, a layer may be disposed between the substrate 102 and the processing layer 103.

The substrate 102 is, however, not limited to silicon wafers and may be appropriately selected from known substrates for semiconductor devices, such as aluminum, titanium-tungsten alloy, aluminum-silicon alloy, aluminum-copper-silicon alloy, silicon oxide, and silicon nitride substrates.

The processing layer 103 may be any layer that can be readily processed using a reversal layer described below as a mask and is resistant to processing of the substrate 102 or another layer serving as the base of the processing layer 103. The processing layer 103 can have the outermost layer of a carbon material, such as spin-on-carbon, diamond-like carbon, or graphite.

The surface of the substrate 102 (processing substrate) or the processing layer 103 used may be subjected to surface treatment, such as silane coupling treatment, silazane treatment, or formation of an organic thin film, for improving the adhesion with the photocurable composition.

In the embodiment, the photocurable composition 101 can be arranged on the substrate 102 or the processing layer 103 by, for example, ink jetting, dip coating, air knife coating, curtain coating, wire bar coating, gravure coating, extrusion coating, spin coating, or slit scanning. In the photo-nanoimprinting, ink jetting can be particularly used. Though the thickness of the pattern-receiving layer (coating film) varies depending on the use, it can be, for example, 0.01 µm or more and 100.0 µm or less.

[Step [2]: Supply of Soluble Gas]

In the present invention, a gas 109 containing a soluble gas is supplied to the space between the mask and the substrate. Throughout the specification, the term "soluble gas" refers to a gas that is dissolved in the photocurable composition in an amount of 1% by volume or more (the volume of the photocurable composition before the dissolution is defined as 100%). In the present invention, the soluble gas is dissolved in the photocurable composition 101 and is uniformly dispersed therein (soluble gas 110 dissolved in the photocurable composition).

The vapor pressure of the soluble gas at the atmospheric temperature in the mold contact step may be at any level, as long as the pressure is not higher than the mold pressure in impression of the mold contact step. The vapor pressure can be 0.1 to 0.4 MPa.

The atmospheric temperature in the mold contact step is not particularly limited and can be 20 to 25 degrees Celsius.

Examples of the soluble gas include fluorocarbons, e.g., chlorofluorocarbons (CFCs), such as trichlorofluoromethane; hydrofluorocarbons (HFCs), such as fluorocarbon (FC), hydrochlorofluorocarbon (HCFC), and 1,1,1,3,3-pentafluoropropane ($CHF_2CH_2$ $CF_3$, HFC-245fa, PFP); and hydrofluoroethers (HFEs), such as pentafluoroethyl-methylether ($CF_3CF_2OCH_3$, HFE-245mc).

Among these soluble gases, from the viewpoint of an excellent solubility at an ambient temperature of 20 to 25 degrees Celsius in the mold contact step, 1,1,1,3,3-pentafluoropropane, trichlorofluoromethane, and pentafluoroethyl-methylether can be particularly used. Furthermore, 1,1,1,3,3-pentafluoropropane can be particularly used because of its excellent safety.

The soluble gases may be used alone or in a mixture of two or more thereof. Furthermore, these soluble gases may be used as a gas mixture with an insoluble gas, such as air, nitrogen, carbon dioxide, helium, or argon. The insoluble gas that is mixed with a soluble gas can be helium from the viewpoint of the filling properties. Helium can pass through the mold 104. Accordingly, when the concaves of the fine pattern on the mold 104 are filled with the gases (soluble gas and helium) in the atmosphere together with (part of) the coating film 106 fill in the mold contact step, helium passes through the mold simultaneous with dissolution or liquefaction of the soluble gas.

[Step [3]: Mold Contact]

Subsequently, as shown in FIGS. 1C and 1D, the coating film of the photocurable composition 101 formed in the previous step (arrangement step) is brought into contact with a mold 104 having a mold pattern to be transferred (FIG. 1C). As a result, the concaves of the fine pattern on the surface of the mold 104 are filled with (part of) the coating film of the photocurable composition 101 to give a coating film 105 filled in the fine pattern of the mold (FIG. 1D).

The mold 104 should be made of a light transmissive material considering the subsequent step (light irradiation step). Examples of the light transmissive material for the mold 104 include glass; quartz; PMMA, light transmissive resins, such as poly-carbonate resins; transparent metal vapor-deposited films; flexible films made of, e.g., polydimethylsiloxane; photocured films, and metal films. When a light transmissive resin is used for the mold 104, the resin should be a resin that is not dissolved in the components contained in the photocurable composition 101. Quartz has a low co-efficient of thermal expansion and a small pattern distortion and can be therefore used as a material for the mold 104.

The fine pattern on the surface of the mold 104 can have a pattern height 112 of 4 nm or more and 200 nm or less. In the method of forming a pattern of the present invention, the pattern height is preferably 10 nm or more and 40 nm or less, more preferably 10 nm or more and 30 nm or less. A lower pattern height reduces the force necessary for releasing the mask from the photocured film of the resist in the mold-releasing step, i.e., reduces the mold-releasing force, and reduces the number of release defects caused by the resist pattern torn off and remains on the mask when the mask is released from the resist. However, an excessively low pattern height reduces the processing accuracy of the processing substrate.

The mold 104 may be subjected to surface treatment, prior to the mold contact step of bringing the photocurable composition 101 and the mold 104 into contact with each other, for improving the detachability between the photocurable composition 101 and the surface of the mold 104. The surface treatment is performed by, for example, applying a mold release agent to the surface of the mold 104 to form a mold release agent layer. Examples of the mold release agent to be applied to the surface of the mold 104 include silicone-based mold release agents, fluorine-based mold release agents, hydrocarbon-based mold release agents, polyethylene-based mold release agents, polypropylene-based mold release agents, paraffin-based mold release agents, montan-based mold release agents, and carnauba-based mold release agents. Commercially available application-type mold release agents, such as Optool (registered trademark) DSX manufactured by Daikin Industries, Ltd., can also be used. These mold release agents may be used alone or in a combination of two or more thereof. Among these agents, the fluorine-based and hydrocarbon-based mold release agents can be particularly used.

In this step (mold contact step), the pressure applied to the photocurable composition 101 in bringing the mold 104 into contact with the photocurable composition 101 as shown in FIG. 1C is not particularly limited. The pressure can be 0 MPa or more and 100 MPa or less, preferably 0 MPa or more and 50 MPa or less, more preferably 0 MPa or more and 30 MPa or less, and most preferably 0 MPa or more and 20 MPa or less.

In this step, the time of the contact of the mold 104 with the photocurable composition 101 is not particularly limited. The time can be 0.1 sec or more and 600 sec or less, preferably 0.1 sec or more and 300 sec or less, more preferably 0.1 sec or more and 180 sec or less, and most preferably 0.1 sec or more and 120 sec or less.

This step (mold contact step) in the present invention is performed in a soluble gas atmosphere as described above, and the pressure can be 0.0001 atm or more and 10 atm or less.

[Step [4]: Light Irradiation]

Subsequently, as shown in FIG. 1E, light is irradiated, through the mold 104, to the contact region of the photocurable composition 101 with the mold 104. More specifically, light is irradiated, through the mold 104, to the coating film 105 filling the fine pattern of the mold 104 (FIG. 1E). As a result, the coating film 105 filling the fine pattern of the mold 104 is cured by the irradiation with light into a cured film 107 having a pattern (FIG. 1E).

The light irradiated to the photocurable composition 101, constituting the coating film 105 filling the fine pattern of the mold 104, is selected depending on the sensitive wavelength of the photocurable composition 101. Specifically, the light is appropriately selected from, for example, ultraviolet light having a wavelength of 150 nm or more and 400 nm or less, X-rays, and electron rays.

Many of commercially available curing aids (photopolymerization initiators) are compounds having sensitivity to ultraviolet light. Accordingly, in particular, the light (irradiation light 106) to be irradiated to the photocurable composition 101 can be ultraviolet light. Examples of light sources emitting ultraviolet light include high-pressure mercury lamps, ultra-high pressure mercury lamps, low-pressure mercury lamps, Deep-UV lamps, carbon arc lamps, chemical lamps, metal halide lamps, xenon lamps, KrF excimer lasers, ArF excimer lasers, and $F_2$ excimer lasers. In particular, the ultra-high pressure mercury lamps can be used. The light sources may be used alone or in a combination. The coating film 105 filling the fine pattern of the mold may be entirely irradiated with light or may be partially irradiated with light.

The light irradiation may be intermittently performed multiple times for the entire region of the substrate or may be continuously performed for the entire region. Furthermore, the light irradiation may be performed for a partial region A in a first irradiation step and then for a region B different from the region A in a second irradiation step.

[Step [5]: Mold Releasing]

Subsequently, the patterned cured film 107 and the mold 104 are detached from each other. In this step (mold-releasing step), as shown in FIG. 1F, the mold 104 is detached from the cured film 107 to give, in an independent condition, a cured film 107 having a pattern inverted from the fine pattern on the surface of the mold 104 in the step [4](light irradiation step). The cured film also remains in the concaves of the concavo-convex pattern of the cured film 107, and this cured film is referred to as residual film 108 hereinafter.

The patterned cured film 107 and the mold 104 may be detached from each other by any method that does not physically damage a part of the patterned cured film 107. The conditions for the detachment are also not particularly limited. For example, the mold 104 may be detached from the cured film 107 by fixing the substrate 102 (processing substrate) and moving the mold 104 so as to separate from the substrate 102, or by fixing the mold 104 and moving the substrate 102 so as to separate from the mold 104, or by pulling the both in the opposite directions.

After this step (mold-releasing step) of the present invention, the patterned cured film 107 is exposed to an insoluble gas atmosphere, such as an air atmosphere, to vaporize the soluble gas dissolved in the photocurable composition. As a result, the portions of the dissolved soluble gas remain as holes 111. Since the holes cannot be observed with, for example, an electron microscope, the size of the holes is believed to be usually 1 nm or less.

A series of steps (production process) including the above-described steps [I] to [5] can provide a cured film 201 having a desired concavo-convex pattern (based on the concavo-convex pattern of the mold 104) at a desired position.

In the method of producing a patterned film of the embodiment, a repeating unit (shot) consisting of steps [1] to [5] can be repeated on a single processing substrate. The repetition of the repeating unit (shot) consisting of steps [1] to [5] can provide a cured film having a plurality of desired concavo-convex patterns (based on the pattern of the mold 104) at desired positions on a processing substrate.

In the present invention, the patterned cured film 107 prepared through steps [1] to [5] is utilized in a reversal process described below in detail for processing a substrate 102 (processing substrate) or a processing layer 103.

[Step [6]: Reversal Layer Formation]

As shown in FIG. 2A, a reversal layer 202 is formed on the patterned cured film 201 (the patterned cured film 107 in the method of producing a patterned film described above) after step [5] such that the concaves of the resist pattern is filled with the reversal layer 202.

The material for the reversal layer 202 can be selected from silicon-based or silicon-containing organic materials, such as $SiO_2$ and SiN; metal oxides, such as $TiO_2$ and $Al_2O_3$; and common metal materials.

For example, the reversal layer 202 can be formed from $SiO_2$ by spin coating of a spin-on-glass (SOG) material or by plasma CVD of tetraethyl orthosilicate (TEOS).

[Step [7]: Partial Removal of Reversal Layer]

In step [6], the reversal layer 202 is also formed on the convex portions of the pattern possessed by the cured film 201 (hereinafter, such a part of the reversal layer 202 is referred to as "surplus reversal layer 205"). This surplus reversal layer 205 is needed to be removed, as shown in FIG. 2B, until the convex portions of the pattern of the cured film 201 are exposed.

The surplus reversal layer 205 may be removed by any method and can be removed by a known method, such as dry etching using a known dry etching apparatus. The source gas for the dry etching is appropriately selected depending on the elemental composition of the reversal layer, and examples thereof include fluorocarbon gases, such as $CF_4$, $CHF_4$, $C_2F_6$, $C_3F_8$, $C_4F_8$, $CF_4$, $C_4F_6$, $CCl_2F_2$, and $CBrF_3$; and halogen gases, such as $CCl_4$, $BCl_3$, $PCl_3$, $SF_6$, and $Cl_2$. These gases may be used in a mixture.

[Step [8-1]: Resist Etching]

The patterned cured film 201 is etched. The etching starts from the portions exposed in step [7] using the reversal layer 202 filling the concaves of the resist pattern as a mask. This step forms a concavo-convex pattern of the reversal layer 202 as shown in FIG. 2C. The etching may be performed by any method. A known method, such as dry etching using a known dry etching apparatus can be employed. The source gas for the dry etching is appropriately selected depending on the elemental composition of the resist layer, and examples thereof include oxygen-containing gases, such as $O_2$, CO, and $CO_2$; inert gases, such as He, $N_2$, and Ar; gases such as $N_2$, $H_2$, and $NH_3$. These gases may be used in a mixture.

It is generally said that an etching mask at the completion of the etching is desired to have a thickness of a half or more of the initial thickness in order to secure a high processing accuracy of the etching. The dry etching rate of the photocured film in this step (resist etching step) of the present invention is higher than that in known other methods, and the etching is promptly accomplished. Accordingly, even if the thickness of the reversal layer 202 used as the etching mask is small, a satisfactory processing accuracy can be achieved.

[Step [8-2]: Processing Layer Etching]

Subsequently, in the present invention, the processing layer 203 (the processing layer 103 in the method of producing a patterned film described above) is also etched as shown in FIG. 2D using the concavo-convex pattern of the reversal layer 202 as the etching mask to give a processing layer 206 having a pattern. In this case, the etching may be performed under the same conditions as or different conditions from those for the etching of the resist layer.

In the present invention, since the resist etching step is promptly accomplished and the reversal layer 202 with a sufficient thickness remains, a high processing accuracy can be achieved.

The patterned processing layer 206 prepared through steps [1] to [7], [8-1], and [8-2] can be used as an optical component (including a case of using as a member of the optical component), such as a diffraction grating or a polarizing plate, of an optical part. In such a case, the optical part can at least include the substrate 204 (the substrate 104 in the method of producing a patterned film described above) and the patterned processing layer 206 on the substrate 204.

The patterned processing layer 206 prepared by the method of forming a pattern of the embodiment can also be utilized as a film for interlayer dielectric included in an electronic part, such as a semiconductor element, or can also be utilized as a resist film in production of a semiconductor element, such as an LSI, system LSI, DRAM, SDRAM, RDRAM, or D-RDRAM.

When the patterned processing layer 206 is used as a mask for processing a substrate, for example, etching or ion implantation is performed for the substrate having a surface partially exposed by the step [8-2] of etching (the region indicated by reference number 207 in FIG. 2D). On this occasion, the patterned processing layer 206 functions as an etching mask. In addition, in the formation of an electronic part, a circuit structure based on the pattern of the patterned processing layer 206 can be formed on the substrate 204. As a result, a circuit board that is utilized in an element, such as a semiconductor element, can be produced. Furthermore, an electronic device, such as a display, camera, or medical device, can be formed by connecting the circuit board to a mechanism, such as a circuit controller.

EXAMPLES

The present invention will now be described in detail by way of examples, but the technical scope of the invention is not limited to the following examples.

(Conditions for Reversal Process)

The conditions for the reversal process will be described in detail with reference to FIG. 3.

(Material for Each Layer)

A Si substrate was used as the substrate 304; diamond-like carbon (DLC) was used as the processing layer 303; and spin-on-glass (SOG, T-111 manufactured by Honeywell) was used as the reversal layer 302.

Materials of each photocurable composition are shown in Examples and Comparative Examples described below.

(Production of Photocured Film from Photocurable Composition for Measuring Dry Etching Rate)

Two microliters of a photocurable composition was dropwise applied onto a silicon wafer provided with an adhesion-accelerating layer having a thickness of 60 nm as an adhesion layer and was covered with quartz glass having a thickness of 1 mm to fill a region of 25×25 mm with the photocurable composition to form a coating film.

Subsequently, the coating film was irradiated with light emitted from a UV light source equipped with a high-pressure mercury lamp and passed through an interference filter described below for 200 seconds through the quartz glass. The interference filter used in the light irradiation was VPF-25C-10-15-31300 (manufactured by Sigma Koki Co., Ltd.), and the ultraviolet light as the irradiation light had a single wavelength of 313±5 nm and an illumination of 1 mW/cm$^2$.

After the light irradiation, the quartz glass was removed to give a photocured film of the photocurable composition having an average thickness of 3.2 μm on the silicon wafer.

(Measurement of Dry Etching Rate of Each Layer)

DLC and SOG materials were dry etched for 500 sec using etching gases O$_2$ and Ar at flow rates of 5 sccm and 15 sccm, respectively, with a high density plasma etching apparatus manufactured by ULVAC, Inc. The dry etching rate (nm/s) calculated from the thickness decreased by the dry etching was 1.9 nm/s in the DLC and 0.21 nm/s in the SOG.

Dry Etching Rate of Photocured Film

It is known (NPL 1) that there is a relationship between the dry etching rate V of a composition consisting of organic materials and the total number N of the atoms, the total number $N_C$ of the carbon atoms, and the total number $N_O$ of the oxygen atoms in the composition represented by Expression (1):

V is proportional to $N/(N_C-N_O)$, where, $N/(N_C-N_O)$ is commonly called "Ohnishi parameter" (hereinafter, referred to as OP).

In the embodiment, the dry etching rate of the photocured film of the photocurable composition used in the present invention is assumed to be proportional to the OP value of component (A), which is the main component of the photocurable composition. When the component (A) is composed of a plurality of polymerizable compounds $A_1$, $A_2$, . . . , and $A_n$, the OP value can be calculated as a weighted average value based on the mole fractions represented by Expression (2):

$$OP = \sum_{i=n} n_i OP_i = n_1 OP_1 + n_2 OP_2 + \ldots + n_n OP_n \quad \text{[Math. 1]}$$

where, $OP_n$ represents the OP value of component $A_n$; and $n_n$ represents the mole fraction of component $A_n$ relative to the total mole of the component (A).

The dry etching rate of an organic material having an OP value of 2.43 was 4.0 nm/s under the above-mentioned dry etching conditions. Accordingly, the dry etching rate of each photocurable composition was estimated by dividing the OP value of the component (A) by 2.43 and multiplying the quotient by 4.0 nm/s.

The dry etching rate (nm/s) can also be calculated by dry etching the photocured film produced from a photocurable composition prepared as described above and measuring the thickness decreased by the dry etching.

(Thickness of Each Layer)

The pattern height, i.e., the thickness of the reversal layer 302 was 30 nm, the thickness of the residual film was 70 nm, and the thickness of the processing layer 303 was 110 nm.

Example 1

(1) Preparation of Photocurable Composition (a-1)

A component (A) and a component (B) shown below were mixed. The mixture was filtered through an ultra-high molecular weight polyethylene filter of a pore size of 0.2 μm to prepare a photocurable composition (a-1) of Example 1.

(1-1) Component (A): 94 parts by weight in total, composed of:

A-1: isobornyl acrylate (manufactured by Kyoeisha Chemical Co., Ltd., trade name: IB-XA): 9.0 parts by weight, A-2: benzyl acrylate (manufactured by Osaka Organic Chemical Industry Ltd., trade name: V#160): 38.0 parts by weight, and A-3: neopentyl glycol diacrylate (manufactured by Kyoeisha Chemical Co., Ltd., trade name: NP-A): 47 parts by weight.

(1-2) Component (B): 3 parts by weight in total, composed of:

B-1: Lucirin (registered trademark) TPO (manufactured by BASF SE): 3 parts by weight (2) Measurement of Viscosity of Photocurable Composition (a-1)

The viscosity of the photocurable composition (a-1) was 3.72 mPa*s at 25 degrees Celsius as measured with a cone-and-plate rotational viscometer RE-85L (manufactured by Toki Sangyo Co., Ltd.).

(3) Measurement of Saturation Solubility of Soluble Gas in Photocurable Composition (a-1)

Three grams of the photocurable composition was put in a 9-mL dark brown bottle and was bubbled with 1,1,1,3,3-pentafluoropropane ($CHF_2CH_2CF_3$, HFC-245fa, PFP) at a flow rate of 0.1 L/min for 15 min at 23 degrees Celsius and 1 atm. The volumes before and after the bubbling were measured. The thus-determined saturation solubility was 60.8% by volume.

(4) Formation of Photocured Film

A photocured film was formed in accordance with the above-described procedure of forming a photocured film.

The dry etching rate and necessary etching thickness of the reversal layer in the reversal process using the resulting cured film were estimated as follows.

(5) Dry Etching Rate of Cured Film of Photocurable Composition (a-1)

The component (A) of the photocurable composition (a-1) has an OP value of 3.53. The dry etching rate of an organic material having an OP value of 2.43 is 4.0 nm/s under the above-mentioned dry etching conditions. Accordingly, the dry etching rate of the cured film produced from the photocurable composition (a-1) having an OP value of 3.53 in an insoluble gas atmosphere is estimated to be 5.81 nm/s. Therefore, the dry etching rate of the cured film produced in a PFP atmosphere is estimated to be 9.34 nm/s.

(6) Etching Thickness of Reversal Layer

The time required for etching 70 nm of the photocurable composition layer and 110 nm of the processing layer under the above-mentioned conditions is estimated to be 68.6 sec. The reversal layer is estimated to be etched by a thickness of 14.4 nm during the required period of time.

Example 2

(1) Preparation of Photocurable Composition (a-2)

A component (A) and a component (B) shown below were mixed. The mixture was filtered through an ultra-high molecular weight polyethylene filter of a pore size of 0.2 μm to prepare a photocurable composition (a-2) of Example 2.

(1-1) Component (A): 100 parts by weight in total, composed of:

A-1: isobornyl acrylate (manufactured by Kyoeisha Chemical Co., Ltd., trade name: IB-XA): 75 parts by weight, and A-4: 1,10-decanediol acrylate (manufactured by Shin-Nakamura Chemical Co., Ltd., trade name: A-DOD-N): 25 parts by weight.

(1-2) Component (B): 3 parts by weight in total, composed of:

B-1: Lucirin (registered trademark) TPO (manufactured by BASF SE): 3 parts by weight.

(2) Measurement of Viscosity of Photocurable Composition (a-2)

The viscosity of the photocurable composition (a-2) measured as in Example 1 was 7.83 mPa*s.

(3) Measurement of Saturation Solubility of Soluble Gas in Photocurable Composition (a-2)

The saturation solubility of PFP in the photocurable composition (a-2) measured as in Example 1 was 40.6% by volume.

(4) Formation of Photocured Film

A photocured film was formed in accordance with the above-described procedure of forming a photocured film.

The dry etching rate and necessary etching thickness of the reversal layer in the reversal process using the resulting cured film were estimated as follows.

(5) Dry Etching Rate of Cured Film of Photocurable Composition (a-2)

The OP value of the component (A) of the photocurable composition (a-2) was 3.31. The dry etching rate calculated as in Example 1 of the photocurable composition (a-2) is estimated to be 5.45 nm/s. Accordingly, the dry etching rate of the cured film produced in a PFP atmosphere is estimated to be 7.7 nm/s.

(6) Etching Thickness of Reversal Layer

The time required for etching 70 nm of the photocurable composition layer and 110 nm of the processing layer under the above-mentioned conditions is estimated to be 70.9 sec. The reversal layer is estimated to be etched by a thickness of 14.9 nm during the required period of time.

Comparative Example 1

(1) Preparation of Photocurable Composition (b-1)

A component (A) and a component (B) shown below were mixed. The mixture was filtered through an ultra-high molecular weight polyethylene filter of a pore size of 0.2 μm to prepare a photocurable composition (b-1) of Comparative Example 1.

(1-1) Component (A): 100 parts by weight in total, composed of:

A-5: 2-ethyl-2-adamantyl acrylate (manufactured by Osaka Organic Chemical Industry Ltd., trade name: EtADA): 75 parts by weight, and A-6: dimethylol tricyclodecane diacrylate (manufactured by Kyoeisha Chemical Co., Ltd., trade name: DCP-A): 25 parts by weight.

(1-2) Component (B): 3 parts by weight in total, composed of:

B-1: Lucirin (registered trademark) TPO (manufactured by BASF SE): 3 parts by weight.

(2) Measurement of viscosity of photocurable composition (b-1)

The viscosity of the photocurable composition (b-1) measured as in Example 1 was 44.9 mPa*s.

(3) Measurement of Saturation Solubility of Soluble Gas in Photocurable Composition (b-1)

The saturation solubility of PFP in the photocurable composition (b-1) measured as in Example 1 was 18.8% by volume.

(4) Formation of Photocured Film

A photocured film was formed in accordance with the above-described procedure of forming a photocured film.

The dry etching rate and necessary etching thickness of the reversal layer in the reversal process using the resulting cured film were estimated as follows.

(5) Dry Etching Rate of Cured Film of Photocurable Composition (b-1)

The OP value of the component (A) of the photocurable composition (b-1) was 3.06. The dry etching rate calculated as in Example 1 of the photocurable composition (b-1) is estimated to be 5.04 nm/s. Accordingly, the dry etching rate of the cured film produced in a PFP atmosphere is estimated to be 5.98 nm/s.

(6) Etching Thickness of Reversal Layer

The time required for etching 70 nm of the photocurable composition layer and 110 nm of the processing layer under the above-mentioned conditions is estimated to be 74.6 sec. The reversal layer is estimated to be etched by a thickness of 15.7 nm during the required period of time.

Evaluation of Applicability of Cured Films Formed in Examples and Comparative Example to Reversal Process In order to evaluate the applicability of each cured film to the reversal process, the results in Examples 1 and 2 and Comparative Example 1 are collectively shown in Table 1.

TABLE 1

| | Composition | Saturation solubility of soluble gas | Viscosity (mPa * s) | Etching thickness of reversal layer (nm) |
|---|---|---|---|---|
| Example 1 | (a-1) | 60.8 | 3.72 | 14.4 |
| Example 2 | (a-2) | 40.6 | 7.83 | 14.9 |
| Comparative Example 1 | (b-1) | 18.8 | 44.9 | 15.7 |

As shown in Table 1, in the reversal process using the cured film formed in Example 1 or 2, the etching thickness of the reversal layer was less than 15 nm, which is a half of the thickness 30 nm of the reversal layer in the embodiment. In general, an etching mask at the completion of the etching is desired to have a thickness of a half or more of the initial thickness. Accordingly, a sufficient processing accuracy can be achieved in Examples 1 and 2. That is, even in photo-imprinting using a mold having a height of the concavo-convex pattern of 30 nm at the most, a sufficient processing accuracy can be achieved.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-039403, filed Feb. 27, 2015, which is hereby incorporated by reference herein in its entirety.

The invention claimed is:

1. A method of forming a pattern, comprising:
arranging a photocurable composition on a substrate;
bringing a mold having a concavo-convex pattern into contact with the photocurable composition;
irradiating the photocurable composition with light to form a cured film;
releasing the mold from the cured film;
forming a reversal layer on the cured film having a concavo-convex pattern transferred from the mold;
partially removing the reversal layer to expose the convexes of the concavo-convex pattern in such a manner that the reversal layer remains in the concaves of the concavo-convex pattern formed on the cured film;
etching the photocurable composition layer using the reversal layer remaining in the concaves as a mask to form a reversal pattern, wherein
the mold is brought into contact with the photocurable composition in an atmosphere of a soluble gas having a solubility in the photocurable composition;
the soluble gas has a saturation solubility in the photocurable composition of at least 60.8% by volume, and
the mold has a concavo-convex pattern height of 4 nm or more and 30 nm or less.

2. The method of forming a pattern according to claim 1, wherein the photocurable composition at least includes a polymerizable compound (A) and a photopolymerization initiator (B).

3. The method of forming a pattern according to claim 1, wherein the photocurable composition has a viscosity of 1 mPa*s or more and 12 mPa*s or less.

4. The method of forming a pattern according to claim 1, wherein the mold has a concavo-convex pattern height of 10 nm or more and 30 nm or less.

5. The method of forming a pattern according to claim 1, wherein the photocurable composition further includes a solvent (D).

6. The method of forming a pattern according to claim 1, wherein the reversal layer is made of a spin-on-glass material.

7. The method of forming a pattern according to claim 1, wherein the substrate has an outermost layer of a carbon material.

8. The method of forming a pattern according to claim 7, wherein the outermost layer has a thickness of at least 110 nm.

9. The method of forming a pattern according to claim 1, wherein the bringing of the mold into contact with the photocurable composition is performed in an atmosphere of a gas mixture of the soluble gas and an insoluble gas in the photocurable composition.

10. The method of forming a pattern according to claim 9, wherein the insoluble gas is helium.

11. The method of forming a pattern according to claim 1 wherein the soluble gas is 1,1,1,3,3-pentafluoropropane.

12. The method of forming a pattern according to claim 1, wherein the mold has a surface of quartz.

* * * * *